(12) United States Patent
Dube et al.

(10) Patent No.: US 9,881,790 B2
(45) Date of Patent: Jan. 30, 2018

(54) METHOD TO ENHANCE GROWTH RATE FOR SELECTIVE EPITAXIAL GROWTH

(71) Applicant: Applied Materials, Inc., Santa Clara, CA (US)

(72) Inventors: Abhishek Dube, Fremont, CA (US);
Xuebin Li, Sunnyvale, CA (US);
Yi-Chiau Huang, Fremont, CA (US);
Hua Chung, San Jose, CA (US);
Schubert S. Chu, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/091,332

(22) Filed: Apr. 5, 2016

(65) Prior Publication Data

US 2016/0300715 A1    Oct. 13, 2016

Related U.S. Application Data

(60) Provisional application No. 62/146,046, filed on Apr. 10, 2015.

(51) Int. Cl.
*H01L 21/02* (2006.01)
(52) U.S. Cl.
CPC .... *H01L 21/02576* (2013.01); *H01L 21/0262* (2013.01); *H01L 21/02381* (2013.01); *H01L 21/02532* (2013.01); *H01L 21/02636* (2013.01)

(58) Field of Classification Search
CPC combination set(s) only.
See application file for complete search history.

(56) References Cited

U.S. PATENT DOCUMENTS

| 5,316,958 A | 5/1994 | Meyerson |
| 5,700,520 A | 12/1997 | Beinglass et al. |

(Continued)

FOREIGN PATENT DOCUMENTS

| CN | 1875461 A | 12/2006 |
| JP | H1041321 A | 2/1998 |

(Continued)

OTHER PUBLICATIONS

Wang et al, Low Temperature Silicon Selective Epitaxial; Growth(SEG) and Phosphorous Doping in a; Reduced-Pressure Pancake Reactor, Purdue University, Purdue e-Pubs, ECE Technical Reports, Electrical and Computer Engineering, Apr. 1, 1992.

(Continued)

*Primary Examiner* — Kyoung Lee
*Assistant Examiner* — Ratisha Mehta
(74) *Attorney, Agent, or Firm* — Patterson + Sheridan LLP

(57) ABSTRACT

Embodiments of the present disclosure generally relate to methods for forming a doped silicon epitaxial layer on semiconductor devices at increased pressure and reduced temperature. In one embodiment, the method includes heating a substrate disposed within a processing chamber to a temperature of about 550 degrees Celsius to about 800 degrees Celsius, introducing into the processing chamber a silicon source comprising trichlorosilane (TCS), a phosphorus source, and a gas comprising a halogen, and depositing a silicon containing epitaxial layer comprising phosphorus on the substrate, the silicon containing epitaxial layer having a phosphorus concentration of about $1\times10^{21}$ atoms per cubic centimeter or greater, wherein the silicon containing epitaxial layer is deposited at a chamber pressure of about 150 Torr or greater.

20 Claims, 2 Drawing Sheets

(56) References Cited

U.S. PATENT DOCUMENTS

| | | |
|---|---|---|
| 5,731,626 A | 3/1998 | Eaglesham et al. |
| 6,107,197 A | 8/2000 | Suzuki |
| 6,197,666 B1 | 3/2001 | Schafer et al. |
| 6,346,452 B1 | 2/2002 | Kabir et al. |
| 6,391,749 B1 | 5/2002 | Park et al. |
| 6,579,752 B2 | 6/2003 | De Boer |
| 6,869,579 B2 | 3/2005 | Ohmi et al. |
| 7,166,528 B2 | 1/2007 | Kim et al. |
| 7,176,111 B2 | 2/2007 | Baert et al. |
| 7,195,985 B2 | 3/2007 | Murthy et al. |
| 7,776,698 B2 | 8/2010 | Ye et al. |
| 8,394,196 B2 | 3/2013 | Kim |
| 8,685,845 B2 | 4/2014 | Dube et al. |
| 2003/0045063 A1 | 3/2003 | Oda |
| 2005/0079691 A1 | 4/2005 | Kim et al. |
| 2006/0071213 A1 | 4/2006 | Ma et al. |
| 2006/0234488 A1 | 10/2006 | Kim et al. |
| 2008/0079691 A1 | 4/2008 | Kuboyama et al. |
| 2008/0102602 A1 | 5/2008 | Park et al. |
| 2008/0169512 A1 | 7/2008 | Doyle et al. |
| 2008/0182075 A1 | 7/2008 | Chopra et al. |
| 2009/0026496 A1 | 1/2009 | Bauer et al. |
| 2010/0120235 A1 | 5/2010 | Huang et al. |
| 2010/0163997 A1 | 7/2010 | Drobny et al. |
| 2010/0224937 A1 | 9/2010 | Sridhar |
| 2011/0124169 A1* | 5/2011 | Ye .................. C23C 16/325 438/299 |
| 2011/0147828 A1 | 6/2011 | Murthy et al. |
| 2013/0089961 A1* | 4/2013 | Shin .................. H01L 29/1054 438/294 |
| 2013/0210221 A1* | 8/2013 | Huang ............. H01L 21/02532 438/509 |
| 2013/0320429 A1* | 12/2013 | Thomas ............ H01L 29/66712 257/329 |
| 2014/0024203 A1 | 1/2014 | Destefanis et al. |
| 2014/0084369 A1 | 3/2014 | Murthy et al. |
| 2014/0106547 A1 | 4/2014 | Ye et al. |
| 2015/0064884 A1 | 3/2015 | Cheng et al. |
| 2015/0287826 A1* | 10/2015 | Cheng ................ H01L 29/7848 257/20 |

FOREIGN PATENT DOCUMENTS

| | | |
|---|---|---|
| JP | 2011044692 A | 3/2011 |
| KR | 20040101927 A | 12/2004 |
| KR | 20080067442 A | 7/2008 |

OTHER PUBLICATIONS

International Search Report and Written Opinion for International Application No. PCT/US2016/022702 dated Mar. 16, 2016.
Search Report and Written Opinion dated Mar. 16, 2012 for International Application No. PCT/US2011/045795.
Chinese Office Action dated Mar. 15, 2016 for Application No. 201180066837.0.
Chinese Office Action dated Jun. 30, 2015 for Application No. 201180066837.0.
Chinese Office Action dated Nov. 19, 2015 for Application No. 201180066837.0.
Huang et al., "Further study on structural and electronic properties of silicon phosphide compounds with 3:4 stoichiometry", Computational Materials Science, Elsevier, Amsterdam, NL, Aug. 2004 vol. 30, No. 3-4, pp. 371-375.
Maiti C. K. et al., "Chapter 2: StrainedLayer Epitaxy", Strained Heterostructures : Materials and Devices, 2001, pp. 24-97.
European Search Report dated Oct. 9, 2016 for Application No. 118581628.
Taiwan Office Action dated Jul. 28, 2015 for Application No. 103137871.
Office Action dated Aug. 3, 2012 for U.S. Appl. No. 13/193,576.
Final Office Action dated Feb. 27, 2013 for U.S. Appl. No. 13/193,576.
Office Action dated Sep. 9, 2014 for U.S. Appl. No. 14/133,148.
Final Office Action dated May 5, 2015 for U.S. Appl. No. 14/133,148.
ffice Action dated Nov. 12, 2015 for U.S. Appl. No. 14/133,148.

* cited by examiner

METHOD TO ENHANCE GROWTH RATE FOR SELECTIVE EPITAXIAL GROWTH

CROSS-REFERENCE TO RELATED APPLICATIONS

This application claims priority to U.S. provisional patent application Ser. No. 62/146,046, filed Apr. 10, 2015, which is herein incorporated by reference.

FIELD

Embodiments of the disclosure generally relate to the field of semiconductor manufacturing processes and devices, more particularly, to methods of depositing silicon-containing films for forming semiconductor devices.

BACKGROUND

Size reduction of metal-oxide-semiconductor field-effect transistors (MOSFET) has enabled the continued improvement in speed performance, density, and cost per unit function of integrated circuits. One way to improve transistor performance is through application of stress to the transistor channel region. Stress distorts (e.g., strains) the semiconductor crystal lattice, and the distortion, in turn, affects the band alignment and charge transport properties of the semiconductor. By controlling the magnitude of stress in a finished device, manufacturers can increase carrier mobility and improve device performance.

One approach of introducing stress into the transistor channel region is to incorporate carbon into the region during the formation of the region. The carbon present in the region affects the semiconductor crystal lattice and thereby induces stress. However, the quality of epitaxially-deposited films decreases as carbon concentration within the film increases. Thus, there is a limit to the amount of tensile stress which can be induced before film quality becomes unacceptable.

Generally, carbon concentrations above about 1 atomic percent seriously reduce film quality and increase the probability of film growth issues. For example, film growth issues such as undesired polycrystalline or amorphous silicon growth, instead of epitaxial growth, may occur due to the presence of carbon concentrations greater than 1 atomic percent. Therefore, the benefits that can be gained by increasing the tensile stress of a film through carbon incorporation are limited to films having carbon concentrations of 1 atomic percent or less. Moreover, even films which contain less than 1 atomic percent carbon still experience some film quality issues.

Therefore, it would be desirable to provide processes that can produce a carbon-free, high tensile stress epitaxial film with good selective growth rate.

SUMMARY

Embodiments of the present disclosure generally relate to methods for forming a phosphorus-containing silicon epitaxial layer on semiconductor devices at increased pressure and reduced temperature. In one embodiment, the method includes heating a substrate disposed within a processing chamber to a temperature of about 550 degrees Celsius to about 800 degrees Celsius, introducing into the processing chamber a silicon source comprising trichlorosilane (TCS), a phosphorus source, and a gas comprising a halogen, and depositing a silicon containing epitaxial layer comprising phosphorus on the substrate, the silicon containing epitaxial layer having a phosphorus concentration of about $1\times10^{21}$ atoms per cubic centimeter or greater, wherein the silicon containing epitaxial layer is deposited at a chamber pressure of about 150 Torr or greater.

In another embodiment, the method includes thermally heating a substrate disposed within a processing chamber to a temperature of about 600 degrees Celsius to about 750 degrees Celsius, introducing a gas mixture into the processing chamber, the gas mixture consisting essentially of a germanium source, a dopant source, and a halogen, and depositing a germanium containing epitaxial layer on the substrate, the germanium containing epitaxial layer having a dopant concentration of about $1\times10^{21}$ atoms per cubic centimeter or greater, wherein the germanium containing epitaxial layer is deposited at a chamber pressure of about 300 Torr or greater.

In yet another embodiment, the method includes heating a substrate disposed within a processing chamber to a temperature of about 600 degrees Celsius to about 750 degrees Celsius, introducing a gas mixture into the processing chamber, the gas mixture consisting essentially of a germanium source, a dopant source, and a halogen, and depositing a germanium containing epitaxial layer on the substrate, the germanium containing epitaxial layer having a dopant concentration of about $1\times10^{21}$ atoms per cubic centimeter or greater, wherein the germanium containing epitaxial layer is deposited at a chamber pressure of about 300 Torr or greater.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
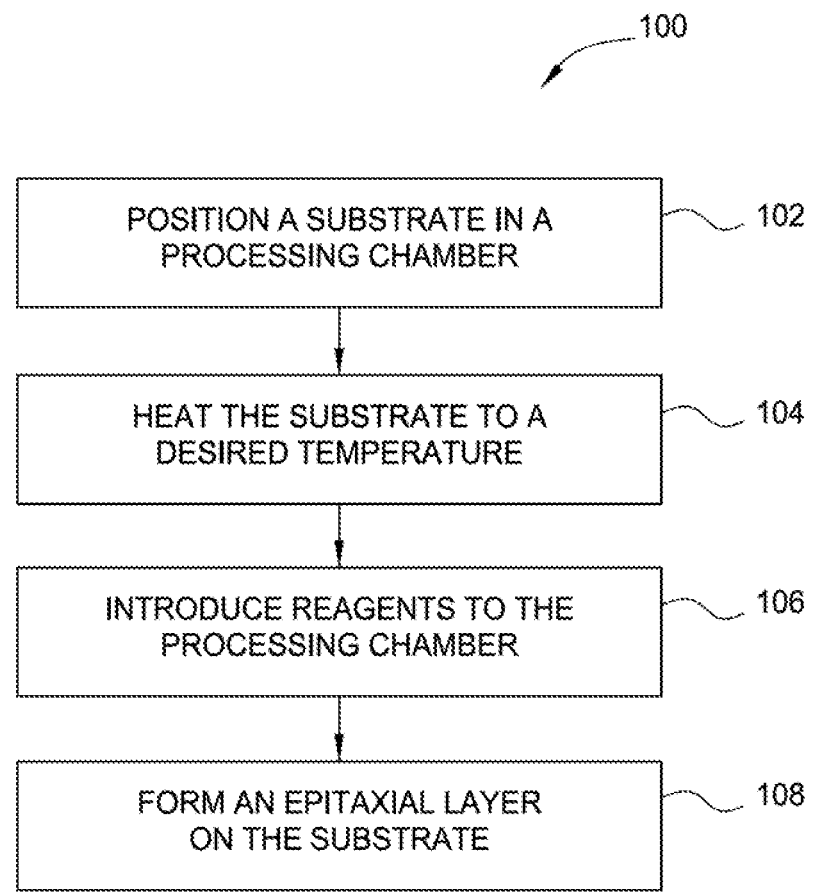
FIG. 1 depicts a flow chart of a method for manufacturing an integrated circuit according to embodiments of the disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure generally provide selective epitaxy processes for phosphorous-containing silicon layer with high phosphorous concentration. In various embodiments, the selective epitaxy process uses a silicon source comprising trichlorosilane (TCS) and optionally dichlorosilane (DCS), a phosphorous dopant source, and a gas comprising a halogen, and is performed at increased process pressures above 300 Torr and a reduced process temperature of about 550 degrees Celsius to about 800 degrees Celsius to allow for formation of a silicon epitaxial film having a phosphorus concentration of $1\times10^{21}$ atoms per cubic centimeter or greater. A phosphorus concentration of about $1 \times 10^{21}$ atoms per cubic centimeter or greater increases the tensile strain of the deposited layer, leading to increased carrier mobility and improved device performance for MOSFET structures. The use of TCS and DCS has also been observed to be able to boost the selective growth rate and selectivity with reduced usage of halogen, while maintaining phosphorus incorporation at or above $1 \times 10^{21}$ atoms per cubic centimeter. Various embodiments are discussed in more detail below.

Embodiments of the present disclosure may be practiced in the CENTURA® RP Epi chamber available from Applied Materials, Inc., of Santa Clara, Calif. It is contemplated that other chambers, including those available from other manufacturers, may be used to practice embodiments of the disclosure.

FIG. 1 is a flow chart 100 illustrating a method of forming an epitaxial layer according to embodiments of the present disclosure. At box 102, a substrate is positioned within a processing chamber. It is contemplated that the substrate may be a planar substrate or a patterned substrate. Patterned substrates are substrates that include electronic features formed into or onto a processing surface of the substrate. The substrate may contain monocrystalline surfaces and/or one secondary surface that is non-monocrystalline, such as polycrystalline or amorphous surfaces. Monocrystalline surfaces include the bare crystalline substrate or a deposited single crystal layer usually made from a material such as silicon, germanium, silicon germanium or silicon carbon. Polycrystalline or amorphous surfaces may include dielectric materials, such as oxides or nitrides, specifically silicon oxide or silicon nitride, as well as amorphous silicon surfaces. It is understood that the substrate may include multiple layers, or include, for example, partially fabricated devices such as transistors, flash memory devices, and the like.

At box 104, the substrate is heated to a target temperature. The processing chamber may be kept at a temperature in the range from about 250 degrees Celsius to about 1000 degrees Celsius, which can be tailored to a particular conducted process. The appropriate temperature to conduct an epitaxial process may depend on the particular precursors used to deposit and/or etch the silicon-containing materials. In various embodiments, the temperature to pre-heat the processing chamber is about 850 degrees Celsius or less, for example about 750 degrees Celsius or less. In one example, the substrate is heated to a temperature of about 550 degrees Celsius to about 800 degrees Celsius, for example about 600 degrees Celsius to about 750 degrees Celsius, such as about 650 degrees Celsius to about 725 degrees Celsius. In another example, the substrate is heated to a temperature of about 550 degrees Celsius to about 750 degrees Celsius. In yet another example, the substrate is heated to a temperature of about 600 degrees Celsius to about 850 degrees Celsius. It is possible to minimize the thermal budget of the final device by heating the substrate to the lowest temperature sufficient to thermally decompose process reagents and deposit a layer on the substrate. However, as increased temperatures generally lead to increased throughput, it is contemplated that higher temperatures may be used as dictated by production requirements.

At box 106, one or more processing reagents are introduced into the processing chamber. The processing reagents may be introduced into the processing chamber concurrently or sequentially in the form of a gas mixture or separated gas mixtures. The processing reagents may include one or more deposition gases, one or more halogen precursors, and at least one dopant gas. The deposition gas may include one or more precursor gases selected from group III precursor gas, group V precursor gas, group VI precursor gas, or group IV precursor gas. In cases where a silicon-containing epitaxial layer is formed, the deposition gas may contain at least a silicon source. The deposition gas may optionally contain at least one secondary elemental source, such as a germanium source. In cases where a germanium-containing epitaxial layer is desired, the deposition gas may contain at least a germanium source without the existence of silicon source. It is contemplated that other elements, such as metals, halogens or hydrogen may be incorporated within a silicon-containing or germanium-containing epitaxial layer, usually in part per million (ppm) concentrations.

Dopant gas provides the deposited epitaxial layer with desired conductive characteristic and various electric characteristics, such as directional electron flow in a controlled and desired pathway required by the electronic device. Exemplary dopant gas may include, but are not limited to phosphorous, boron, arsenic, gallium, or aluminum, depending upon the desired conductive characteristic of the deposited epitaxial layer.

Exemplary silicon sources may include, but are not limited to, silanes, halogenated silanes, silicon tetrachloride ($SiCl_4$), or combinations thereof. Silanes may include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$). Halogenated silanes may include monochlorosilane (MCS), dichlorosilane (DCS), trichlorosilane (TCS), hexachlorodisilane (HODS), octachlorotrisilane (OCTS), silicon tetrachloride (STC), or a combination thereof. In one embodiment, the silicon source comprises TCS. In another embodiment, the silicon source comprises TCS and DCS. In yet another embodiment, the silicon source comprises $SiCl_4$ and DCS.

The halogen precursor may be flowed simultaneously or concurrently with the deposition gas (i.e., co-flow mode) during the epitaxial process. In some embodiments, the deposition gas may be continuously flowed into the processing chamber with the halogen precursor provided at predetermined interval(s), such as about every 1 second, every 3 seconds, or every 5 seconds, or other suitable interval desired by an operator. Alternatively, the deposition gas and the halogen precursor may be provided alternatingly into the processing chamber.

Exemplary halogen precursors may be those containing halogen molecules, such as chlorine gas or hydrogen chloride. In one embodiment, the halogen precursor is hydrogen chloride (HCl). The hydrogen chloride may be delivered as hydrogen chloride gas or as separate hydrogen and chlorine gases that are reacted in the processing chamber to form HCl. Effective formation of heavily doped N-type films has been observed with the halogen precursor using HCl at a temperature range between about 500 degrees Celsius and about 750 degrees Celsius, for example about 650 degrees Celsius to about 725 degrees Celsius.

In some embodiments, the deposition gas and the halogen precursor may be separately flowed into the processing chamber. In some embodiments, the deposition gas and the halogen precursor may be pre-mixed and formed as a gas mixture before flowing into the processing chamber. In either case, the flow ratio of the deposition gas and the halogen precursor in the processing chamber may be about 20:1 to about 3:1, for example about 12:1 to about 6:1, for example about 10:1 to about 8:1. If two silicon sources are used in the deposition gas, for example $SiCl_4$ and DCS, the flow ratio of $SiCl_4$:HCl may be about 12:1 to about 6:1, for example about 10:1 to about 8:1 while the flow ratio of DCS:HCl may be about 3:1 to about 1.5:1, for example about 2:1 to about 1.8:1. It is contemplated that DCS, SiCl$_4$, and HCl mentioned herein can be replaced with any other silicon source and halogen precursor described in this disclosure using the flow ratio described herein. For example, a flow ratio of the halogen precursor and TCS may be about 12:1 to about 6:1, and a flow ratio of the halogen precursor and DCS may be about 3:1 to about 1.5:1.

The processing reagents may optionally include a carrier gas. The carrier gas may be selected based on the precursor(s) used and/or the process temperature during the epitaxial process. Suitable carrier gases include nitrogen, hydrogen, argon, helium, or other gases which are inert with respect to the epitaxial process. Nitrogen may be utilized as a carrier gas in embodiments featuring low temperature (e.g., <850° C.) processes. The carrier gas may have a flow rate from about 1 SLM (standard liters per minute) to about 100 SLM, such as from about 3 SLM to about 30 SLM.

In one exemplary embodiment where a phosphorus-containing silicon epitaxial layer is desired, the processing reagents may comprise a silicon source comprising TCS, a phosphorous source, and HCl. TCS may be provided into the processing chamber at a flow rate in a range from about 200 sccm to about 400 sccm, such as about 250 sccm to about 350 sccm, for example about 300 sccm. An exemplary phosphorus source includes phosphine, which may be delivered to the processing chamber at a rate of about 0.1 sccm to about 950 sccm, such as from about 0.5 sccm to about 150 sccm, for example, about 95 sccm. HCl may be provided into the processing chamber at a rate in a range from about 50 sccm to about 200 sccm, such as about 80 sccm to about 150 sccm, for example about 110 sccm. The concentration of TCS in the silicon source may be at least about 15% or greater, such as about 25% or greater, such as about 45% or greater, for example about 65% to about 90%.

In another exemplary embodiment where a phosphorus-containing silicon epitaxial layer is desired, the processing reagents may comprise a silicon source comprising TCS and DCS, a phosphorous source, and HCl. TCS may be provided into the processing chamber at a flow rate in a range from about 200 sccm to about 400 sccm, such as about 250 sccm to about 350 sccm, for example about 300 sccm. DCS may be provided into the processing chamber at a flow rate in a range from about 400 sccm to about 600 sccm, such as about 350 sccm to about 550 sccm, for example about 500 sccm. An exemplary phosphorus source includes phosphine, which may be delivered to the processing chamber at a rate of about 0.1 sccm to about 950 sccm, such as from about 0.5 sccm to about 150 sccm, for example, about 95 sccm. HCl may be provided into the processing chamber at a rate in a range from about 50 sccm to about 200 sccm, such as about 80 sccm to about 150 sccm, for example about 100 sccm. The concentration of TCS in the silicon source may be at least about 15% or greater, such as about 25% or greater, such as about 45% or greater, for example about 65% to about 85%. Depending upon the concentration of TCS, the concentration of DCS in the silicon source may be at least about 15% or greater, such as about 25% or greater, such as about 45% or greater, for example about 65% to about 85%. If desired, TCS described in this embodiment may be replaced with silicon tetrachloride (SiCl$_4$). In some embodiments, a silicon source comprising SiCl$_4$, TCS and DCS may be used. In such a case, SiCl$_4$ may be provided into the processing chamber at the same flow rate as TCS or DCS as discussed in this embodiment. In any of these examples, TCS may be first flowed into the processing chamber and served as a pre-treatment gas to passivate the dielectric surfaces of the substrate, followed by DCS and/or SiCl$_4$ (in any desired sequence).

At box 108, the mixture of reagents is thermally reacted to form a phosphorus-containing silicon epitaxial layer on the substrate surface. During the process, the temperature within the processing chamber is maintained at about 550 degrees Celsius to about 800 degrees Celsius, for example about 600 degrees Celsius to about 750 degrees Celsius, such as about 650 degrees Celsius to about 725 degrees Celsius. The pressure within the processing chamber is maintained at about 150 Torr or greater, for example, about 300 Torr to about 600 Torr. It is contemplated that pressures greater than about 600 Torr may be utilized when low pressure deposition chambers are not employed. In contrast, typical epitaxial growth processes in low pressure deposition chambers maintain a processing pressure of about 10 Torr to about 100 Torr and a processing temperature greater than 700 degrees Celsius. However, it has been observed that by increasing the pressure to about 150 Torr or greater, for example about 300 Torr or greater, the deposited epitaxial film can be formed with a greater phosphorus concentration (e.g., about $1 \times 10^{21}$ atoms per cubic centimeter to about $5 \times 10^{21}$ atoms per cubic centimeter) as compared to lower pressure epitaxial growth processes.

The phosphorus concentration of an epitaxial film formed at a pressure less than 100 Torr is approximately $3 \times 10^{20}$ atoms per cubic centimeter when providing a phosphine flow rate of about 3 sccm to about 5 sccm. Thus, epitaxial layers formed at higher pressures (e.g., 300 Torr or greater) can experience approximately a tenfold increase in phosphorus concentration compared to epitaxial films formed at pressures below about 100 Torr or less.

Not wishing to be bound by theory, it is believed that at a phosphorus concentration of about $1 \times 10^{21}$ atoms per cubic centimeter or greater, the deposited epitaxial film is not purely a silicon film doped with phosphorus, but rather, that the film is an alloy between silicon and silicon phosphide (e.g., pseudocubic structure of $Si_3P_4$). It is believed that the silicon/silicon phosphide alloy attributes to the increased tensile stress of the epitaxial film. The likelihood of forming the silicon/silicon phosphide alloy increases with greater phosphorus concentrations, since the probability of adjacent phosphorus atoms interacting is increased.

Epitaxial films which are formed at process temperatures between about 600 degrees Celsius and about 750 degrees Celsius and at pressures above 300 Torr experience increased tensile stress when doped to a sufficient phosphorus concentration (e.g., about $1 \times 10^{21}$ atoms per cubic centimeter or greater). In general, selective epitaxy process permits growth of epitaxial layers on a silicon surface with minimized epitaxial layer growth on a dielectric surface (e.g., oxides or nitrides). In order to maintain selectivity (i.e., to achieve crystalline growth on silicon surfaces of the substrate without any growth on dielectric surfaces) during the epitaxy process, the deposition gases, the halogen precursor, and reaction temperatures may be regulated and adjusted throughout the epitaxy process. While it is difficult to achieve both high phosphorus concentration in silicon epitaxy and desired growth rate with smooth morphology at low temperatures, it has been surprisingly observed by the present inventors that deposition of phosphorus-containing silicon epitaxial layer using a silicon source comprising TCS can significantly promote the selective growth rate at higher temperatures such as above 600 degrees Celsius or greater, for example about 725 degrees Celsius to about 800 degrees Celsius. Without being bounded by any particular theory, it is believed that the weaker Si—H bond in TCS (which is SiCl$_3$—H) creates Si—Cl reactive species upon decomposition, which passivate the dielectric surfaces, and hence leading to a longer incubation time on the exposed dielectric surfaces. As a result, the growth selectivity is enhanced at higher temperatures even with a low supply of halogen precursor. Enhanced growth rate and selectivity can also be achieved in cases where TCS and DCS are both used as the silicon source, where DCS and SiCl$_4$ are used as the silicon source, or where TCS, DCS, and SiCl$_4$ are used as the silicon source.

Therefore, if the substrate comprises a dielectric surface and a silicon surface, TCS may be used as a pre-treatment gas to passivate the dielectric surfaces. In such a case, the silicon source comprising TCS may be flowed into the processing chamber, followed by DCS. The substrate may be exposed to TCS pre-treatment gas for a predetermined period of time (depending on the size of the substrate), for example about 1 second to about 120 seconds, for example about 5 seconds to about 60 seconds, for example about 10 seconds to about 30 seconds.

Table 1 below illustrates the phosphorus concentration and improvement on selective growth rate of a phosphorous-containing epitaxial layer formed using DCS alone and DCS+TCS supplied at different flow increases according to embodiments of the present disclosure. In all examples shown in Table 1, DCS was provided at a flow rate of about 500 sccm, and TCS was provided at a flow rate of about 30 sccm, 60 sccm, 120 sccm, and 240 sccm, respectively. Phosphine was provided at a flow rate of about 950 sccm (10% in H$_2$). HCl (not shown) was provided at a flow rate of about 100 sccm. Nitrogen gas (not shown), which serves as a carrier gas, was provided at a flow rate of about 3 SLM. In all examples, the processing chamber was heated and maintained at about 650 degrees Celsius, with a chamber pressure of about 300 Torr. The process conditions described herein and throughout this disclosure are based on a 300 mm diameter substrate.

TABLE 1

| | Silicon Source | Selective GR (Å/min) | GR Improvement % | [P] by SIMS (atoms/cc) |
|---|---|---|---|---|
| 1 | DCS | 23 | — | 2.20 × 10$^{21}$ |
| 2 | DCS + TCS (30 sccm) | 26 | 13 | 2.33 × 10$^{21}$ |
| 3 | DCS + TCS (60 sccm) | 27 | 17 | 2.38 × 10$^{21}$ |
| 4 | DCS + TCS (120 sccm) | 28 | 21 | 2.45 × 10$^{21}$ |
| 5 | DCS + TCS (240 sccm) | 31 | 35 | 2.50 × 10$^{21}$ |

Figure 2:
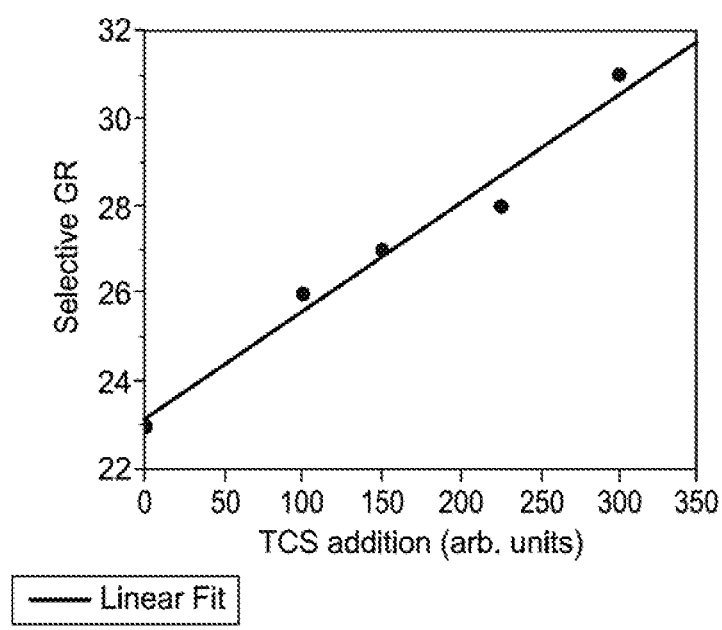
FIG. 2 depicts a graph illustrating a proportional relationship between selective growth rate and TCS addition according to embodiments of the disclosure.

As can be seen in Examples 1-5, when the TCS is added to DCS during the epitaxial process, the selective growth rate was favorably increased from about 23 Å/min to about 31 Å/min, which is about 35% improvement. In the meantime, the phosphorus concentration was increased from about 2.20×10$^{21}$ atoms per cubic centimeter to about 2.50× 10$^{21}$ atoms per cubic centimeter. The fact that the phosphorus concentration is greater suggests that the addition of the TCS enhances the phosphorous incorporation into the layer while boost the selective growth rate. The growth rate boost is also evidenced in FIG. 2, which is a graph illustrating the selective growth rate versus TCS addition for Examples 1-5 shown in Table 1 plotted using a linear fitted line.

The epitaxial process at boxes 106 and 108 may be repeated or maintained until the predetermined thickness and/or film profile is achieved.

It should be noted that the concept described in embodiments of the present disclosure is also applicable to epitaxy process for forming other materials. Some possible examples may include undoped silicon, SiGe/SiGe:B, Si:CP, pure Ge, GeSn, GeP, GeB, or GeSnB, etc., which may be used in logic and memory applications. In such cases, possible silicon precursors may be the same as those described above with respect to FIG. 1, and possible germanium precursors may include, but are not limited to GeH$_4$ and Ge$_2$H$_6$. Examples of halogenated germanium that may be used to promote growth rate may include, but are not limited to GeCl$_4$, GeHCl$_3$, Ge$_2$Cl$_6$, Ge$_3$Cl$_6$, etc.

In the embodiment where a germanium containing epitaxial layer is desired, the processing chamber may be kept at a temperature in the range from about 550 degrees Celsius to about 800 degrees Celsius, for example about 600 degrees Celsius to about 750 degrees Celsius, such as about 650 degrees Celsius to about 725 degrees Celsius. The processing reagents may comprise a germanium source, a dopant source, and a precursor gas comprising a halogen. The dopant source and the halogen may be those discussed above with respect to FIG. 1. For example, the dopant gas may include phosphorous, boron, arsenic, gallium, or aluminum. The halogen precursor may include chlorine gas or hydrogen chloride. The germanium source, such as those germanium precursors or halogenated germanium discussed above, may be provided into the processing chamber at a flow rate in a range from about 200 sccm to about 400 sccm, such as about 250 sccm to about 350 sccm, for example about 300 sccm. Alternatively, the germanium source may include both germanium precursors and halogenated germanium as discussed above. An exemplary dopant source includes phosphine, which may be delivered to the processing chamber at a rate of about 0.1 sccm to about 950 sccm, such as from about 0.5 sccm to about 150 sccm, for example, about 95 sccm. The halogen precursor such as HCl may be provided into the processing chamber at a rate in a range from about 50 sccm to about 200 sccm, such as about 80 sccm to about 150 sccm, for example about 110 sccm. The pressure within the processing chamber may be maintained at about 150 Torr or greater, for example, about 300 Torr to about 600 Torr. The deposited germanium epitaxial film is formed with a greater phosphorus concentration of about 1×10$^{21}$ atoms per cubic centimeter to about 5×10$^{21}$ atoms per cubic centimeter.

In some embodiments, the flow ratio of the germanium source and the halogen precursor in the processing chamber may be about 20:1 to about 3:1, for example about 12:1 to about 6:1, for example about 10:1 to about 8:1. If two germanium sources are used in the deposition gas, for example germanium precursors and halogenated germanium, the flow ratio of germanium precursors:HCl may be about 12:1 to about 6:1, for example about 10:1 to about 8:1 while the flow ratio of halogenated germanium:HCl may be about 3:1 to about 1.5:1, for example about 2:1 to about 1.8:1. It is contemplated that germanium precursors, halogenated germanium, and HCl mentioned herein can be any germanium source and halogen precursor described in this disclosure using the flow ratio described herein.

Benefits of the present disclosure include promoting the growth rate and selectivity of a selective epitaxy process for phosphorous-containing silicon layer using a silicon source comprising trichlorosilane (TCS), a phosphorous dopant source, and a precursor gas comprising halogen molecules. Increased process pressures combined with reduced process temperatures below about 800 degrees Celsius allow for effectively removal of possible silicon nuclei from dielectric surfaces and formation of a silicon epitaxial film having a phosphorus concentration of $3 \times 10^{21}$ atoms per cubic centimeter or greater, without sacrificing the throughput. The high phosphorus concentration induces stress within the deposited epitaxial film, thereby increasing tensile strain, leading to increased carrier mobility and improved device performance.

While the foregoing is directed to embodiments of the present disclosure, other and further embodiments of the disclosure may be devised without departing from the basic scope thereof.

The invention claimed is:

1. A method of forming a film on a substrate, comprising:
heating a substrate disposed within a processing chamber to a temperature of about 550 degrees Celsius to about 800 degrees Celsius; and
exposing the substrate to a silicon source comprising trichlorosilane (TCS) and dichlorosilane (DCS), a phosphorus source, and a gas comprising a halogen to deposit a carbon-free, silicon containing epitaxial layer comprising phosphorus on the substrate, the silicon containing epitaxial layer having a phosphorus concentration of about $1 \times 10^{21}$ atoms per cubic centimeter or greater, wherein the silicon containing epitaxial layer is deposited at a chamber pressure of about 150 Torr or greater, and the TCS and the DCS are introduced into the processing chamber at a TCS:DCS flow ratio of 1:2 to 1:16.

2. The method of claim 1, wherein the chamber pressure is about 300 Torr to about 600 Torr.

3. The method of claim 1, wherein the halogen is chlorine gas or hydrogen chloride.

4. The method of claim 1, wherein the temperature is within a range from about 600 degrees Celsius to about 750 degrees Celsius.

5. The method of claim 1, wherein the halogen is hydrogen chloride (HCl), and a flow ratio of the silicon source and the halogen is about 12:1 to about 6:1.

6. The method of claim 1, further comprising:
introducing a germanium containing gas into the processing chamber and the silicon containing epitaxial layer is a doped silicon germanium.

7. A method of forming an epitaxial film on a substrate, comprising:
providing a substrate into a processing chamber, the substrate comprising a silicon surface and a dielectric surface;
exposing the substrate to a pre-treatment gas consisting essentially of trichlorosilane (TCS) at a temperature of about 550 degrees Celsius to about 800 degrees Celsius to passivate the dielectric surface; and then
while supplying TCS into the processing chamber, introducing dichlorosilane (DCS), a dopant source, and a halogen into the processing chamber at a chamber pressure of 300 Torr or greater to deposit a carbon-free, silicon containing epitaxial layer on the substrate, wherein the carbon-free, silicon containing epitaxial layer has a dopant concentration of about $1 \times 10^{21}$ atoms per cubic centimeter or greater, and the TCS and DCS are supplied into the processing chamber at a TCS:DCS flow ratio of 1:2 to 1:16.

8. The method of claim 7, wherein the dopant source comprises phosphorous, boron, arsenic, gallium, or aluminum.

9. The method of claim 7, wherein the dopant source comprises phosphorus and the silicon containing epitaxial layer is pseudocubic structure of $Si_3P_4$.

10. The method of claim 7, wherein the halogen is chlorine gas or hydrogen chloride.

11. The method of claim 7, wherein a flow ratio of the halogen and TCS is about 12:1 to about 6:1, and a flow ratio of the halogen and DCS is about 3:1 to about 1.5:1.

12. The method of claim 7, wherein the concentration of TCS in the silicon source is about 65% to about 90%.

13. The method of claim 7, wherein the mixture of process gases further comprises a germanium containing gas.

14. A method of forming a film on a substrate, comprising:
heating a substrate disposed within a processing chamber to a temperature of about 600 degrees Celsius to about 750 degrees Celsius;
introducing a gas mixture into the processing chamber, the gas mixture consisting essentially of a germanium source, a halogenated germanium precursor, a dopant source, and a halogen, wherein the flow ratio of the germanium source:halogen is about 6:1 to about 12:1 and the flow ratio of the halogenated germanium precursor: halogen is about 1.5:1 to about 3:1; and
depositing a carbon-free, germanium containing epitaxial layer on the substrate, the germanium containing epitaxial layer having a dopant concentration of about $1 \times 10^{21}$ atoms per cubic centimeter or greater, wherein the germanium containing epitaxial layer is deposited at a chamber pressure of about 300 Torr or greater.

15. The method of claim 14, wherein the germanium source comprises $GeH_4$, $Ge_2H_6$, or a combination thereof.

16. The method of claim 14, wherein the dopant gas comprises phosphorous, boron, arsenic, gallium, or aluminum.

17. The method of claim 14, wherein the halogen is hydrogen chloride or chlorine gas.

18. The method of claim 1, wherein the silicon source further comprises silicon tetrachloride ($SiCl_4$).

19. The method of claim 15, wherein the halogenated germanium precursor comprises $GeCl_4$, $GeHCl_3$, $Ge_2Cl_6$, or $Ge_3Cl_8$.

20. The method of claim 19, wherein the germanium source is $GeH_4$ or $Ge_2H_6$ and the halogenated germanium precursor is $GeCl_4$.

* * * * *

UNITED STATES PATENT AND TRADEMARK OFFICE
CERTIFICATE OF CORRECTION

| | | |
|---|---|---|
| PATENT NO. | : 9,881,790 B2 | Page 1 of 1 |
| APPLICATION NO. | : 15/091332 | |
| DATED | : January 30, 2018 | |
| INVENTOR(S) | : Abhishek Dube et al. | |

It is certified that error appears in the above-identified patent and that said Letters Patent is hereby corrected as shown below:

On the Title Page

On the page 2, in Column 2, item [56], under "Other Publications", Line 27, delete "ffice" and insert -- Office --, therefor.

In the Specification

Column 8, Line 12, delete "$Ge_3Cl_6$," and insert -- $Ge_3Cl_8$, --, therefor.

Signed and Sealed this
Twentieth Day of March, 2018

Andrei Iancu
*Director of the United States Patent and Trademark Office*